(12) United States Patent
Clark et al.

(10) Patent No.: US 8,781,772 B2
(45) Date of Patent: Jul. 15, 2014

(54) DETECTION APPARATUS WITH A MATCHING NETWORK FOR NULLING AND ASSOCIATED METHODS

(75) Inventors: Jason A Clark, Orlando, FL (US); James McNeill, Orlando, FL (US)

(73) Assignee: Better World Engineering, Orlando, FL (US)

( * ) Notice: Subject to any disclaimer, the term of this patent is extended or adjusted under 35 U.S.C. 154(b) by 393 days.

(21) Appl. No.: 13/190,946

(22) Filed: Jul. 26, 2011

(65) Prior Publication Data

US 2012/0029855 A1 Feb. 2, 2012

Related U.S. Application Data

(60) Provisional application No. 61/367,946, filed on Jul. 27, 2010.

(51) Int. Cl.
*G01R 13/00* (2006.01)
*G01V 3/10* (2006.01)

(52) U.S. Cl.
CPC .................................... *G01V 3/104* (2013.01)
USPC ......................................................... 702/66

(58) Field of Classification Search
CPC ........ G01V 3/104; G01V 3/105; G01V 3/107
USPC .......................................................... 702/66
See application file for complete search history.

(56) References Cited

U.S. PATENT DOCUMENTS

| | | | | |
|---|---|---|---|---|
| 5,537,041 A | * | 7/1996 | Candy | 324/329 |
| 5,576,624 A | * | 11/1996 | Candy | 324/329 |
| 5,654,637 A | * | 8/1997 | McNeill | 324/329 |
| 5,963,035 A | | 10/1999 | Won | 324/329 |
| 6,104,193 A | | 8/2000 | Bell | 324/329 |
| 6,326,791 B1 | * | 12/2001 | Bosnar | 324/329 |
| 6,809,520 B1 | | 10/2004 | Nelson | 324/329 |
| 6,889,135 B2 | | 5/2005 | Curatolo et al. | 701/207 |
| 7,353,034 B2 | | 4/2008 | Haney | 455/457 |
| 7,394,250 B2 | | 7/2008 | Itozaki et al. | 324/300 |
| 2003/0182055 A1 | | 9/2003 | Curatolo et al. | 701/207 |
| 2004/0260174 A1 | * | 12/2004 | Keene | 600/424 |
| 2008/0227473 A1 | | 9/2008 | Haney | 455/457 |
| 2008/0303517 A1 | * | 12/2008 | Skultety-Betz et al. | 324/234 |
| 2009/0042534 A1 | | 2/2009 | Levanen | 455/404.2 |
| 2009/0045813 A1 | * | 2/2009 | Emery | 324/329 |
| 2010/0267361 A1 | | 10/2010 | Sullivan | 455/404.2 |
| 2011/0037462 A1 | * | 2/2011 | Bosnar | 324/243 |

* cited by examiner

*Primary Examiner* — Michael Nghiem
*Assistant Examiner* — Eman Alkafawi
(74) *Attorney, Agent, or Firm* — Allen, Dyer, Doppelt, Milbrath & Gilchrist, P.A.

(57) ABSTRACT

A detection apparatus includes a transmitter to generate a detection signal, and a coil assembly including a transmit coil and a receive coil. The transmit coil transmits the detection signal toward an object to be detected, with the object to be detected emitting a target signal in response to the transmitted detection signal. The receive coil receives the target signal emitted from the object along with an undesired coupling signal from the transmit coil. A matching network is coupled to the transmitter and generates an adjusted detection signal by adjusting a profile of the detection signal to match a profile of the undesired coupling signal. An output stage has a first input coupled to the receive coil to receive the target signal and the undesired coupling signal, and a second input coupled to the matching network to receive the adjusted transmit signal. The output stage subtracts the adjusted detection signal from the target signal and the undesired coupling signal so that the target signal remains.

15 Claims, 6 Drawing Sheets

DETECTION APPARATUS WITH A MATCHING NETWORK FOR NULLING AND ASSOCIATED METHODS

RELATED APPLICATION

This application claims the benefit of U.S. Provisional Application Ser. No. 61/367,946 filed Jul. 27, 2010, the entire contents of which are incorporated herein by reference.

FIELD OF THE INVENTION

The present invention relates to the field of detecting buried or otherwise visually obscured objects, and more particularly, to a detection apparatus and related method using nulling to remove unwanted signals.

BACKGROUND OF THE INVENTION

In a variety of situations, it may be desirable to determine whether metal objects exist that are obscured from view in some manner. The objects could include buried cables, such as power or communications cables, for example. Other objects could include buried unexploded ordnance and land mines. Buried unexploded ordnance and land mines pose a hazard not only to military personnel in time of war, but also to non-combatants during time of peace.

Electromagnetic induction has long been used to detect hidden or buried metal objects. Typically, a magnetic field generator propagates a primary electromagnetic field that in turn induces a secondary electromagnetic field in a nearby hidden object. A magnetic field sensor spaced from the hidden object senses the induced secondary electromagnetic field, and in the process, detects the hidden object.

Figure 1:
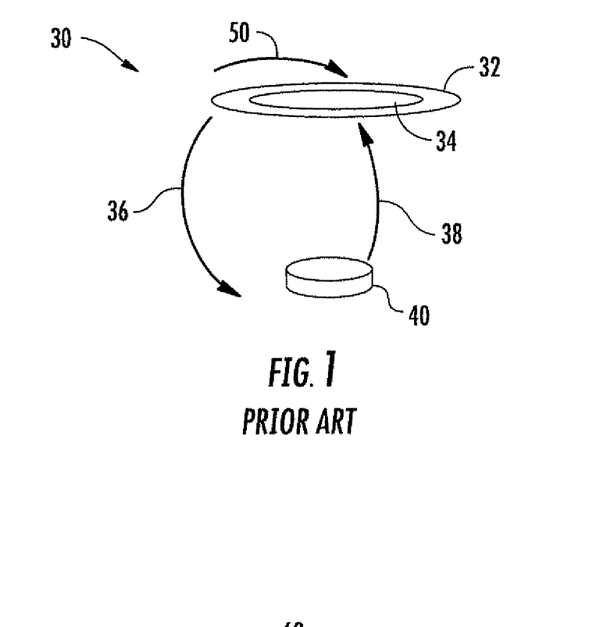
FIG. 1 is a schematic representation of an electromagnetic induction sensor detecting an object in accordance with the prior art.

A typical electromagnetic induction sensor 30 is illustrated in FIG. 1. The electromagnetic induction sensor includes a transmit coil 32 and a receive coil 34. A detection signal is provided to the transmit coil 32, which when transmitted, causes an electromagnetic field 36 to reach a nearby object 40. The electromagnetic field 36 induces eddy currents in the object 40, and a corresponding field 38 is emitted by the object. The corresponding field 38, also referred to as a detection signal, is received by the receive coil 34 along with an undesired coupling signal 50. The undesired coupling signal 50 results from the coupling of the detection signal transmitted by the transmit coil 32 into the receive coil 34.

The problem arises from the fact that the undesired coupling signal 50 may be thousands of times larger than the detection signal 38. For example, the detection signal 38 may be as low as −100 dB while the undesired coupling signal 50 may be as high as −10 dB. Since analog-to-digital converters have a limited voltage input and a limited resolution, the detection signal 38 is limited by how much it can be amplified. The detection signal 38 can typically be amplified a small amount due to the fact that the larger undesired coupling signal 50 will quickly reach the limits of the analog-to-digital converter. For example, if the analog-to-digital converter has a full voltage range of 0-5 volts and the undesired coupling signal 50 results in a 2 volt signal coupled into the receive coil 34, the total signal can be amplified 2.5 times, which leaves the detection signal 38 at a very low level.

Figure 2:
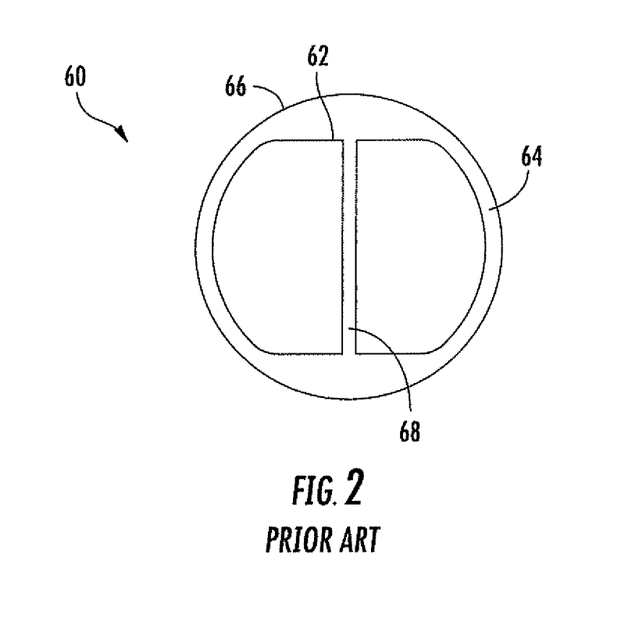
FIG. 2 is a schematic representation of an electromagnetic induction sensor configured as a double-D coil design in accordance with the prior art.

One approach for removing the undesired coupling signal 50 is to use a quadrapole electromagnetic induction sensor 60, or what is more commonly referred to as a double-D coil design, as illustrated in FIG. 2. The quadrapole electromagnetic induction sensor 60 includes two receive coils 62 and 64. Each receive coil 62, 64 has a letter D shape. Since the field of the transmit coil 66 is coupled equally into each of the receive coils 62 and 64, the undesired coupling signal is nearly the same for each coil. An object to be detected under one of the receive coils 62 or 64 would not show equally in each coil. The receive coils 62 and 64 are summed together in a way that subtracts out much of the detection signal. However, this approach has several problems. There is a large dead spot in the center 68 between the two receive coils 62, 64 where no object can be detected. There are two separate areas of highest sensitivity, which results in making localizing or finding an object outline and location more difficult. Moreover, the physical gap 68 in the center between the two receive coils 62, 64 makes it nearly unusable in dual sensor systems where ground penetrating radar or other schemes are used to enhance detection or object discrimination.

Figure 3:
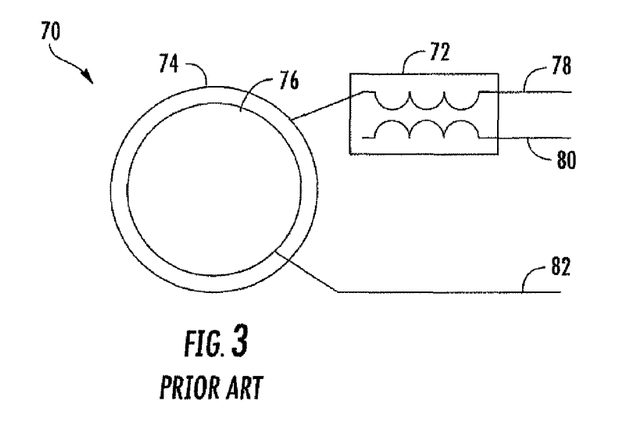
FIG. 3 is a schematic representation of the electromagnetic induction sensor shown in FIG. 1 with a transformer coupled to the transmit coil.

Another approach for an electromagnetic induction sensor 70 uses a transformer 72 that is wound to match the coupling between the transmit coil 74 and the receive coil 76, as illustrated in FIG. 3. The detection signal is fed to one side 78 of the through the transformer 72 before being received by the transmit coil 74. The resulting signal is received on the other side 80 of the transformer 72, and is supposed to be nearly the same as the undesired coupling signal received on the receive coil 76. The resulting signal is then subtracted from the total signal as provided by the receive coil 76 on output line 82 to remove the undesired coupling signal. This method also has several problems. The transformer 72 needs to have a precise custom core and winding for each coil type. The transformer is rather large and heavy, as well as being costly. Moreover, the transformer is only typically matched for a particular coil in a particular environment, which nearly renders the transformer 72 ineffective when moving into different soil environments.

SUMMARY OF THE INVENTION

In view of the foregoing background, it is therefore an object of the present invention to provide a detection apparatus that is relatively straightforward to implement in removing undesired coupling signals without adding additional drawbacks.

This and other objects, advantages and features in accordance with the present invention are provided by a detection apparatus comprising a transmitter to generate a detection signal, and a coil assembly comprising a transmit coil and a receive coil. The transmit coil may be coupled to the transmitter and transmit the detection signal toward an object to be detected, with the object to be detected emitting a target signal in response to the transmitted detection signal. The receive coil may be configured to output the target signal emitted from the object along with an undesired coupling signal from the transmit coil.

A matching network may be coupled to the transmitter to generate an adjusted detection signal by adjusting a profile of the detection signal to match a profile of the undesired coupling signal. An output stage may have a first input coupled to the receive coil to receive the target signal and the undesired coupling signal, and a second input may be coupled to the matching network to receive the adjusted transmit signal, and be configured to subtract the adjusted detection signal from the target signal and the undesired coupling signal.

The detection signal may comprise a continuous wave analog signal. The matching network may be configured to adjust an amplitude and phase of the detection signal. More particularly, the matching network may comprise an amplitude stage to adjust an amplitude of the detection signal to match an amplitude of the undesired coupling signal, and a filter stage to adjust an amplitude roll-off and phase shift of the detection signal to match an amplitude roll-off and phase shift of the undesired coupling signal.

The detection apparatus with the matching network for nulling is low cost, and relatively straightforward to implement. The analog matching network and the output stage advantageously null the undesired coupling signal so that the target signal can be greater amplified, thus making objects much easier to detect.

The detection apparatus may further comprise a digitally sampled matching network. Such a network may include an analog-to-digital converter coupled to the output stage to digitize the target signal output therefrom, a processor coupled to the analog-to-digital converter to sample the digitized target signal, and to generate a digitized playback target signal that is offset in phase with respect to the digitized target signal. A digital-to-analog converter may be coupled to the processor to convert the digitized playback target signal to an analog playback target signal. A final output stage may have a first input coupled to the output state to receive the target signal, and a second input coupled to the digital-to-analog converter, and subtracts the analog playback target signal from the target signal. The digitally sampled matching network advantageously provides an additional gain in addition to the gain provided by the analog matching network.

Another aspect of the present invention is directed to a method for operating a detection apparatus as described above. The method may comprise operating the transmitter to generate a detection signal, and transmitting the detection signal from the transmit coil toward an object to be detected, with the object to be detected emitting a target signal in response to the transmitted detection signal. The target signal emitted from the object may be received by the receive coil along with an undesired coupling signal from the transmit coil. The matching network may be operated to generate an adjusted detection signal by adjusting a profile of the detection signal to match a profile of the undesired coupling signal. The output stage may then be operated to subtract the adjusted detection signal from the target signal and the undesired coupling signal so that the target signal remains.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 4:
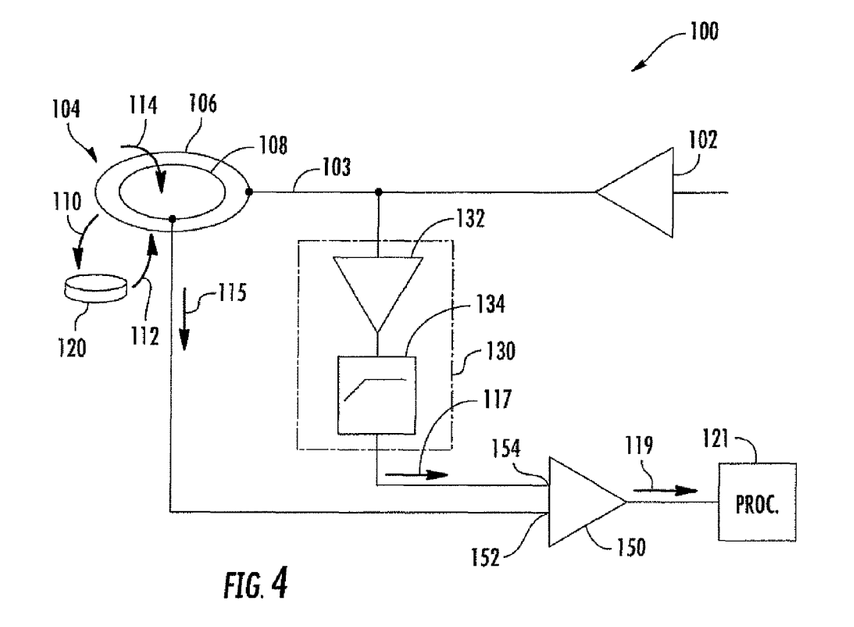
FIG. 4 is a schematic representation of a detection apparatus in accordance with the present invention.

Referring initially to FIG. 4, a detection apparatus 100 includes a transmitter 102 that provides a detection signal, and a coil assembly 104 that includes a transmit coil 106 and a receive coil 108 adjacent the transmit coil. The illustrated coil assembly 104 is configured as a concentric coil design. Other coil assembly configurations are acceptable, as readily appreciated by those skilled in the art.

The transmit coil 106 is coupled to the transmitter via a connection path 103 and is configured to transmit the detection signal 110 toward an object 120 to be detected. The object 120 may be buried or obscured from view in some manner. The object 120 could be buried cables or unexploded ordnance, for example. Alternatively, the object 120 to be detected could be carried by a person. Consequently, the coil assembly 104 may be configured as a cart or part of a vehicle system, or even a walk-through portal, as appreciated by those skilled in the art. The object 120 emits a target signal 112 in response to the transmitted detection signal 110. The receive coil 108 is configured to receive the target signal 112 emitted from the object 120 along with an undesired coupling signal 114 from the transmit coil 106. This combined received signal from the receive coil 108 is represented by reference 115.

A matching network 130 is coupled to an output of the transmitter 102 and is configured to generate an adjusted detection signal by adjusting a profile of the detection signal 110 to match a profile of the undesired coupling signal 114. The adjusted detection signal is represented by reference 117. An output stage 150 has a first input 152 coupled to the receive coil 108 to receive the combined received signal 115 (i.e., target signal 112 and the undesired coupling signal 114), and a second input 154 coupled to the matching network 130 to receive the adjusted transmit signal 117. The output stage 150 is configured to subtract the adjusted detection signal 117 from the combined received signal 115 so that the target 112 signal remains. This approach is relatively straightforward to implement and advantageously allows the resulting target signal after nulling 119, as provided by the output stage 150, to be amplified within a range of 100× to 500×, for example, thus making objects 120 much easier to detect. A processor 121 is coupled downstream from the output stage 150 for processing the resulting target signal after nulling 119 for object detection.

The detection signal 110 is preferably a continuous wave analog signal. The matching network 130 includes an amplitude stage 132 and a filter stage 134 coupled thereto. The amplitude stage 132 performs a gain matching adjustment to adjust an amplitude of the detection signal 110 to match an amplitude of the undesired coupling signal 114. The filter stage 134 is configured as a high pass filter to adjust an amplitude roll-off and phase shift of the detection signal 112 to match an amplitude roll-off and phase shift of the undesired coupling signal 114.

The profile of the detection signal 110 is advantageously adjusted in the matching network 130 to match the amplitude and phase of the undesired coupling signal 114. The output stage 150 may be configured as a differential stage amplifier, and subtracts the adjusted detection signal 117 from the combined output signal 115 as provided by the receive coil 108 so that the undesired coupling signal 114 has essentially been eliminated.

Figure 5:
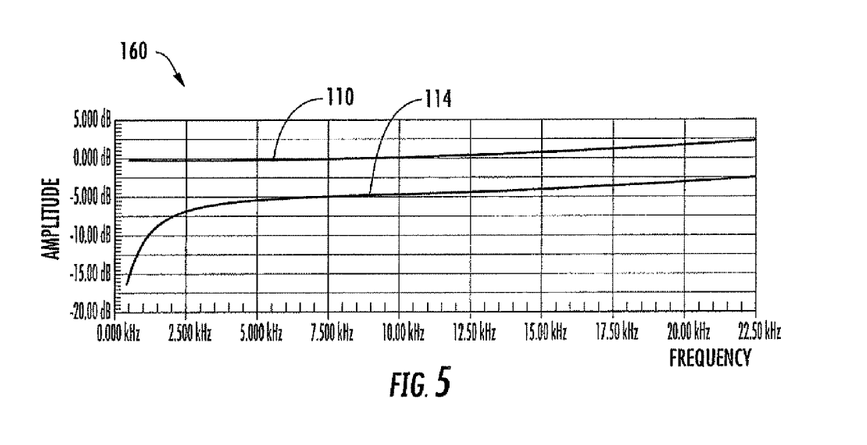
FIG. 5 is a plot of amplitude versus frequency for the detection signal and the undesired coupling signal shown in FIG. 4.
Figure 6:
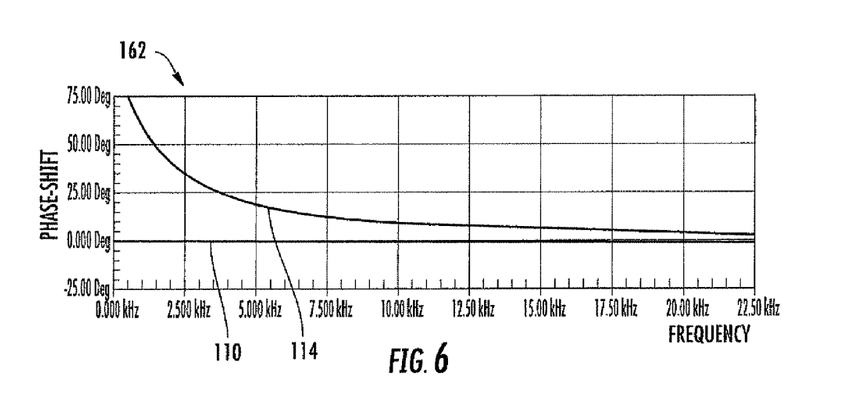
FIG. 6 is a plot of phase shift versus frequency for the detection signal and the undesired coupling signal shown in FIG. 4.

The relationship between the transmitted detection signal 110 and the undesired coupling 114 will now be discussed in reference to FIGS. 5 and 6. A graph 160 illustrating amplitude versus frequency is provided in FIG. 5, and a graph 162 illustrating phase shift versus frequency is provided in FIG. 6.

With respect to the amplitude, the transmitted detection signal 110 is not even over all frequencies. Signal 114 is the unwanted coupling signal from the transmit coil 106. There is a roll-off on the lower frequencies since the transmit and receive coils 106, 108 essentially operate like a transformer. With respect to the phase shift, the undesired coupling signal 114 has a large phase change towards the lower frequencies. Both of these behaviors can be emulated by a first order high pass filter. In other words, the matching network 130 changes the detection signal 110 so that its amplitude and its phase roll-off are similar to those of the undesired coupling signal 114.

Figure 7:
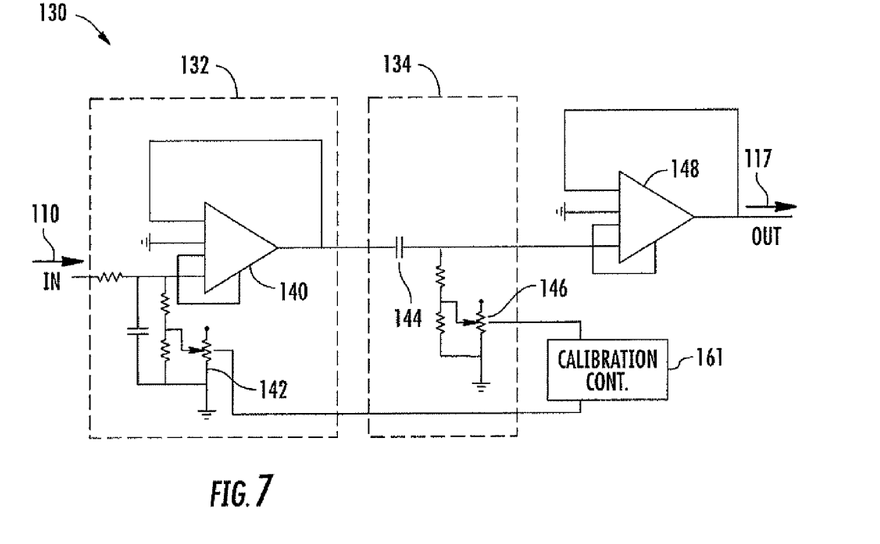
FIG. 7 is a more detailed schematic representation of the matching network shown in FIG. 4.

A more detailed embodiment of the matching network 130 will now be discussed in reference to FIG. 7. The detection signal 110 as received by the matching network 130 is first reduced in a gain adjustment stage 132. The gain adjustment stage 132 includes an amplifier 140, and a potentiometer 142 coupled thereto. The potentiometer 142 is used to adjust the gain for a particular coil assembly for a given operating environment. Although a standard potentiometer 142 is shown for simplicity, the gain adjustment can easily be achieved with a digitally controlled potentiometer for automated calibration in the field. An op-amp with internal an adjustable gain could also be substituted, as readily appreciated by those skilled in the art.

The gain adjusted detection signal is then fed through a first order high pass filter 134 that includes a capacitor 144 to match the low frequency amplitude and phase shift in the coupling between the transmit and receive coils 106, 108. The roll-off can advantageously be adjusted by tuning the potentiometer 146 to move the high pass cut off frequency. This can also be achieved through a digitally controlled potentiometer enabling automated calibration in the field. By allowing for manual or automated calibration in the field, the nulling as described above may be used in many different types of environments. The adjusted detection signal is provided to an output buffer 148.

The matching network 130 includes a controller 161 that allows the matching network 130 to be calibrated. Alternatively, the calibration controller 161 is external the matching network 130 but is still included within the detection apparatus 100. Operation of the detection apparatus 100 with a concentric coil assembly, as illustrated in FIG. 4, results in predicable characteristics of the undesired coupling signal. These characteristics can essentially be re-created by the matching network 130. However, when the detection apparatus 100 is operating in the field, certain conditions may be different than the conditions used in the initial calibration. For example, when looking for buried objects, the soil conditions can effect the calibration of the detection apparatus 100. Consequently, the calibration controller 161 can change the resistances on the illustrated potentiometer 142, 146 so that the undesired coupling signal is essentially removed.

Figure 8:
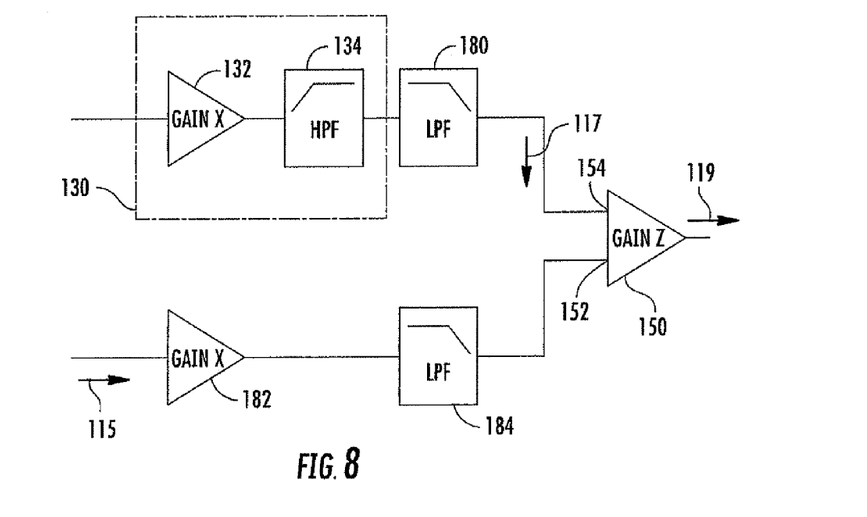
FIG. 8 is a partial schematic representation of the detection apparatus with additional filters and amplifiers in accordance with the present invention.

In the illustrated detection apparatus 100, additional filters and amplifiers may be provided as needed. As illustrated in FIG. 8, for example, the adjusted detection signal from the matching network 130 is provided to a low pass filter 180. The output of the low pass filter 180 is coupled to an input of the output stage 150. On the signal path between the receive coil 108 and the other input of the output stage 150, an amplifier 182 and a low pass filter 184 are provided.

The combined signal from the receive coil 108 may be conditioned with any amount of filtering, but all filtering needs to be replicated in signal path between the matching network 130 and the output stage 150. For instance, the low pass filter 184 is replicated exactly with the low pass filter 180. This is necessary to maintain amplitude and phase matching across all frequencies.

Another aspect is to further improve the nulling of the undesired coupling signal 114 within the detection apparatus 100. As discussed above, the output stage 150 provides the resulting target signal after nulling 119. Object detection analysis is typically performed on this signal.

Figure 9:
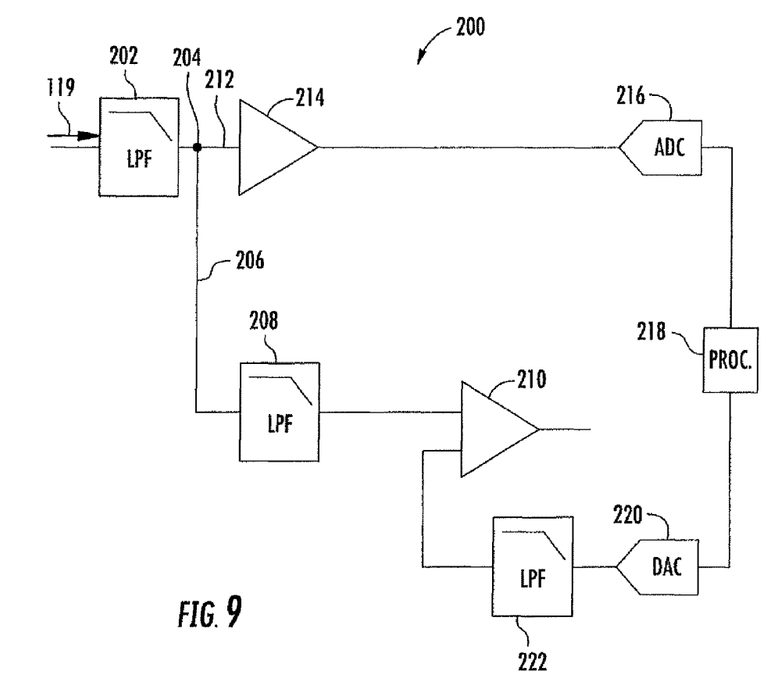
FIG. 9 is a schematic representation of a digitally sampled matching network to be included in the detection apparatus as shown in FIG. 4.

The matching network 130 operates in the analog domain to advantageously allow the resulting target signal after nulling 114 to be amplified within a range of 100× to 500×, for example, thus making objects 120 much easier to detect. To further remove any remains of the undesired coupling signal 114 within the resulting target signal after nulling 119, the detection apparatus 100 includes a digitally sampled matching network 200, as illustrated in FIG. 9. The digitally sampled matching network 200 is positioned between the output stage 150 and the processor 121.

The digitally sampled matching network 200 provides an additional gain of 20× to 50×. Overall, the analog matching network 130 and the digitally sampled matching network 200 together provide a gain of well over 5,000×, for example. Object detection analysis can now be performed on this further enhanced signal.

The digitally sampled matching network 200 receives the resulting target signal after nulling 119 from the output stage 150. The resulting target signal after nulling 119 is passed through a low pass filter 202. At node 204, this signal is split. One path 206 passes the signal through a low pass filter 208 and into a first input of a final output stage 210. The other path 212 passes the signal through a buffering and gain adjustment amplifier 214 before being sampled by an analog-to-digital converter 216. The analog-to-digital converter 216 generates a digitized target signal.

A processor 218 is coupled to the analog-to-digital converter 216 to store the digitized samples. Enough samples are taken by the processor 218 so that there is a repeated pattern in the signal. This pattern is characteristic of the transmitter 102 being used. Moreover, the transmitter 102 may operate over different frequencies, such as 5 khz, 8 khz and 11 khz, for example. Whether single or multiple frequencies are used, a pattern typically repeats, such as every 1,000 samples for example. The processor 218 determines the pattern, which may be at startup or ground balance, for example. The processor 218 thus generates a digitized playback target signal that is offset in phase with respect to the digitized target signal.

The processor 218 plays back the samples through a digital-to-analog converter 220 to convert the digitized playback target signal to an analog playback target signal. The analog samples are passed through a low pass filter 222 to remove noise, and to a second input of the final output stage 210. The low pass filters 208 and 222 are matched so that phase and amplitude shifts are not introduced when filtering. The final output stage 210 is configured to subtract the analog playback target signal from the resulting target signal after nulling 119. The digitally sampled matching network 200 advantageously provides additional gain in addition to the gain provided by the analog matching network 130. Object detection analysis can now be performed on this further enhanced signal, which is the output of the digitally sampled matching network 200.

Another aspect of the present invention is directed to a method for operating a detection apparatus 100 as described above. Referring now to the flow chart 240 illustrated in FIG. 10, the method comprises from the start (Block 242), operating the transmitter 102 to generate a detection signal 110 at Block 244, and transmitting the detection signal 110 from the transmit coil 106 toward an object 120 to be detected at Block 246. The object 120 to be detected emits a target signal 112 in response to the transmitted detection signal 110.

Figure 10:
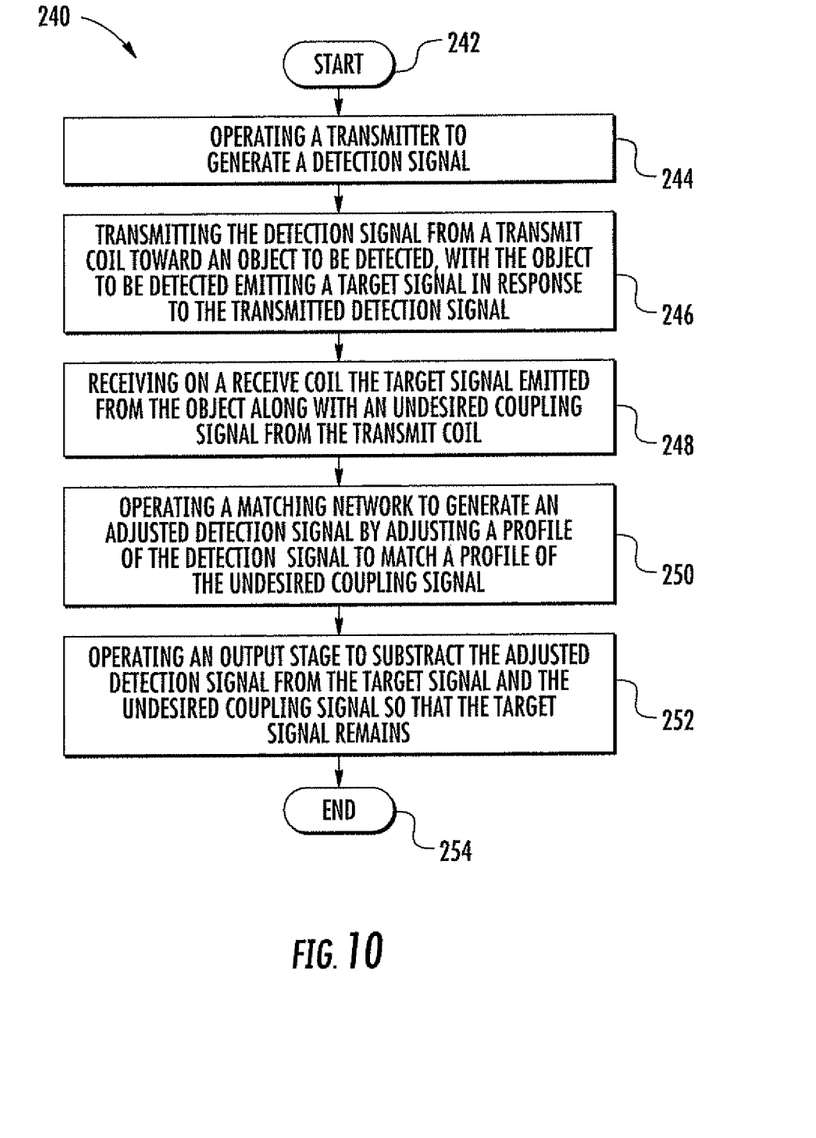
FIG. 10 is a flowchart illustrating a method for operating a detection apparatus in accordance with the present invention.

The method further comprises receiving on the receive coil 108 the target signal 112 emitted from the object 120 along with an undesired coupling signal 114 from the transmit coil 106 at Block 248. The matching network 130 is operated at Block 250 to generate an adjusted detection signal by adjusting a profile of the detection signal 110 to match a profile of the undesired coupling signal 114. The output stage 150 is operated at Block 252 to subtract the adjusted detection signal from the target signal 112 and the undesired coupling signal 114 so that the target signal remains. The method ends at Block 254.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included as readily appreciated by those skilled in the art.

That which is claimed:

1. A detection apparatus comprising: a transmitter configured to generate a detection signal; a coil assembly comprising a transmit coil coupled to said transmitter and configured to transmit the detection signal toward an object to be detected, with the object to be detected emitting a target signal in response to the transmitted detection signal, and a single receive coil adjacent said transmit coil and configured to receive the target signal emitted from the object along with an undesired coupling signal from said transmit coil; a matching network coupled to said transmitter and configured to generate an adjusted detection signal by adjusting a profile of the detection signal to match a profile of the undesired coupling signal; wherein the matching network comprises an amplitude stage coupled to a filter stage; and an output stage having a first input coupled to said single receive coil to receive the target signal and the undesired coupling signal, and a second input coupled to said matching network to receive the adjusted transmit signal, and configured to subtract the adjusted detection signal from the target signal and the undesired coupling signal so that the target signal remains.

2. The detection apparatus according to claim 1 wherein the detection signal comprises a continuous wave analog signal.

3. The detection apparatus according to claim 1 wherein said matching network is configured to adjust an amplitude and phase of the detection signal.

4. The detection apparatus according to claim 1 wherein said matching network comprises:

an amplitude stage to adjust an amplitude of the detection signal to match an amplitude of the undesired coupling signal; and a filter stage to adjust an amplitude roll-off and phase shift of the detection signal to match an amplitude roll-off and phase shift of the undesired coupling signal.

5. The detection apparatus according to claim 4 wherein said filter stage is configured as a high pass filter stage.

6. The detection apparatus according to claim 4 wherein said amplitude stage comprises an adjustable amplifier stage and said filter stage comprises an adjustable filter stage; and wherein said matching network further comprises a calibration controller to calibrate said adjustable amplifier stage and said adjustable filter stage.

7. The detection apparatus according to claim 1 further comprising:

an analog-to-digital converter coupled to said output stage to digitize the target signal output therefrom;

a processor coupled to said analog-to-digital converter and configured to sample the digitized target signal, and to generate a digitized playback target signal that is offset in phase with respect to the digitized target signal;

a digital-to-analog converter coupled to said processor to convert the digitized playback target signal to an analog playback target signal; and a final output stage having a first input coupled to said output state to receive the target signal, and a second input coupled to said digital-to-analog converter, and configured to subtract the analog playback target signal from the target signal.

8. The detection apparatus according to claim 1 further comprising a processor coupled to said output stage and configured to process the target signal therefrom.

9. A method for operating a detection apparatus comprising a transmitter, a coil assembly comprising a transmit coil coupled to the transmitter and a single receive coil adjacent the transmit coil, a matching network coupled to the transmitter, and an output stage having a first input coupled to the single receive coil and a second input coupled to the matching network, wherein the matching network comprises an amplitude stage coupled to a filter stage; the method comprising: operating the transmitter to generate a detection signal; transmitting the detection signal from the transmit coil toward an object to be detected, with the object to be detected emitting a target signal in response to the transmitted detection signal; receiving on the single receive coil the target signal emitted from the object along with an undesired coupling signal from the transmit coil; operating the matching network to generate an adjusted detection signal by adjusting a profile of the detection signal to match a profile of the undesired coupling signal; and operating the output stage to subtract the adjusted detection signal from the target signal and the undesired coupling signal so that the target signal remains.

10. The method according to claim 9 wherein the detection signal comprises a continuous wave analog signal.

11. The method according to claim 9 wherein the matching network adjusts an amplitude and phase of the detection signal.

12. The method according to claim 11 wherein the matching network comprises an amplitude stage to adjust an amplitude of the detection signal to match an amplitude of the undesired coupling signal; and a filter stage to adjust an amplitude roll-off and phase shift of the detection signal to match an amplitude roll-off and phase shift of the undesired coupling signal.

13. The method according to claim 12 wherein the amplitude stage comprises an adjustable amplifier stage and the filter stage comprises an adjustable filter stage; and the method further comprising calibrating the adjustable amplifier stage and the adjustable filter stage.

14. The method according to claim 9 wherein the detection apparatus further comprises an analog-to-digital converter coupled to the output stage, a processor coupled to the analog-to-digital converter, and a digital-to-analog converter coupled to the processor, and a final output stage, the method further comprising:

using the analog-to-digital converter to digitize the target signal from the output stage;

using the processor to sample the digitized target signal, and to generate a digitized playback target signal that is offset in phase with respect to the digitized target signal;

using the digital-to-analog converter to convert the digitized playback target signal to an analog playback target signal; and using the final output stage having a first input coupled to the output state to receive the target signal, and a second input coupled to the digital-to-analog converter, and to subtract the analog playback target signal from the target signal.

15. The method according to claim 9 further comprising processing the target signal from the output stage.

\* \* \* \* \*